United States Patent
Chen

(10) Patent No.: US 8,830,202 B2
(45) Date of Patent: Sep. 9, 2014

(54) TOUCH-SENSING DISPLAY APPARATUS AND FABRICATING METHOD THEREOF

(75) Inventor: Kuang-Jung Chen, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 1185 days.

(21) Appl. No.: 12/703,163

(22) Filed: Feb. 9, 2010

(65) Prior Publication Data

US 2010/0265207 A1 Oct. 21, 2010

(30) Foreign Application Priority Data

Apr. 21, 2009 (TW) .............................. 98113195 A

(51) Int. Cl.
*G09G 5/00* (2006.01)
*G06F 3/044* (2006.01)
*H01L 27/32* (2006.01)
*G06F 3/041* (2006.01)

(52) U.S. Cl.
CPC .............. *G06F 3/044* (2013.01); *H01L 27/323* (2013.01); *G06F 3/0412* (2013.01); *G06F 2203/04111* (2013.01)
USPC .......................................... 345/174; 345/173

(58) Field of Classification Search
USPC ................................................. 345/174, 173
See application file for complete search history.

(56) References Cited

U.S. PATENT DOCUMENTS

| | | | |
|---|---|---|---|
| 5,895,228 A | 4/1999 | Biebuyck et al. | |
| 5,952,778 A | 9/1999 | Haskal et al. | |
| 6,424,094 B1 | 7/2002 | Feldman | |
| 6,623,608 B2 | 9/2003 | Cropper et al. | |
| 6,879,319 B2 | 4/2005 | Cok | |
| 6,885,157 B1 | 4/2005 | Cok et al. | |
| 7,030,860 B1 | 4/2006 | Hsu et al. | |
| 7,042,444 B2 | 5/2006 | Cok | |
| 7,106,307 B2 | 9/2006 | Cok | |
| 7,133,032 B2 | 11/2006 | Cok | |
| 7,202,856 B2 | 4/2007 | Cok | |

(Continued)

FOREIGN PATENT DOCUMENTS

| | | |
|---|---|---|
| TW | 200636588 | 10/2006 |
| TW | 200732794 | 9/2007 |

(Continued)

OTHER PUBLICATIONS

"Office Action of Taiwan counterpart application" issued on Dec. 12, 2013, p. 1-p. 15.

*Primary Examiner* — William Boddie
*Assistant Examiner* — Leonid Shapiro
(74) *Attorney, Agent, or Firm* — Jianq Chyun IP Office

(57) ABSTRACT

A touch-sensing display apparatus including a touch panel, an environmentally sensitive electronic device and an adhesive layer is provided. The water/oxygen vapor transmission rate of the touch panel is lower than $10^{-1}$ g/m$^2$*day, and the touch panel includes a first substrate, a sensing circuit and at least one water/oxygen barrier layer. The first substrate is a first flexible substrate. The sensing circuit and the water/oxygen barrier layer are disposed on the first substrate. The environmentally sensitive electronic device includes a second substrate and a pixel array. The pixel array is disposed on the second substrate and between the first substrate and the second substrate. The adhesive layer is disposed between the touch panel and the environmentally sensitive electronic device. Moreover, a fabricating method of the above-mentioned touch-sensing display apparatus is also provided.

23 Claims, 12 Drawing Sheets

(56) References Cited

U.S. PATENT DOCUMENTS

| | | |
|---|---|---|
| 7,230,608 B2 | 6/2007 | Cok |
| 2003/0030369 A1 | 2/2003 | Shih et al. |
| 2003/0203210 A1 | 10/2003 | Graff et al. |
| 2003/0234769 A1* | 12/2003 | Cross et al. .................. 345/173 |
| 2004/0197944 A1 | 10/2004 | Chen et al. |
| 2005/0046339 A1 | 3/2005 | Ju et al. |
| 2005/0181535 A1 | 8/2005 | Yun et al. |
| 2006/0006798 A1 | 1/2006 | Buckley |
| 2006/0250534 A1* | 11/2006 | Kutscher et al. ................ 349/41 |
| 2007/0049155 A1 | 3/2007 | Moro et al. |
| 2007/0281174 A1 | 12/2007 | Moro et al. |
| 2008/0142352 A1* | 6/2008 | Wright .......................... 200/600 |
| 2008/0261057 A1* | 10/2008 | Slobodin ....................... 428/447 |
| 2011/0168436 A1* | 7/2011 | Simpson ....................... 174/257 |

FOREIGN PATENT DOCUMENTS

| | | |
|---|---|---|
| TW | 200739400 | 10/2007 |
| TW | I297845 | 6/2008 |
| TW | M346864 | 12/2008 |
| TW | M353420 | 3/2009 |

* cited by examiner

TOUCH-SENSING DISPLAY APPARATUS AND FABRICATING METHOD THEREOF

CROSS-REFERENCE TO RELATED APPLICATION

This application claims the priority benefit of Taiwan application serial no. 98113195, filed on Apr. 21, 2009. The entirety of the above-mentioned patent application is hereby incorporated by reference herein and made a part of specification.

BACKGROUND OF THE INVENTION

1. Field of the Invention

The present application relates to a touch-sensing display apparatus and a fabricating method thereof, and more particularly to a touch-sensing display apparatus adopting a touch barrier panel as a package structure and having a better water/oxygen vapor transmission rate (WVTR/OTR) and a fabricating method thereof.

2. Description of Related Art

Input devices of many information products have been changed from conventional keyboards and mice to touch apparatuses so as to comply with requirements for convenience, miniaturization, and being user-friendly. The touch apparatuses can be assembled to various flat panel displays to equip the same with functions of both displaying frames and inputting information of operation.

On the other hand, organic light emitting diode (OLED) refers to a semiconductor device which is capable of converting electric energy into light energy and has advantages of self-luminescence, extra slimness, high contrast, short response time (within a few microseconds), significantly wide view angle, low power consumption, wide work temperature range, panel flexibility, and so forth. Hence, the OLED is frequently applied to a number of electronic products.

In consideration of the advantages of the touch apparatus and the OLED, an OLED touch-sensing display apparatus formed by integrating the touch apparatus and the OLED can be applied in a more extensive manner. Nonetheless, device performance of the OLED is decayed by moisture and oxygen, and therefore it is necessary to further package the OLED during integration of the OLED and the touch apparatus to prevent entry of moisture and oxygen. In a conventional touch apparatus, a touch structure is formed on a substrate, while the OLED is formed on another substrate. After the two substrates are assembled, the assembled substrates are then packaged with use of adhesives. As a result, the OLED touch-sensing display apparatus inevitably has certain thickness. Therefore, issues of miniaturizing the integrated OLED touch-sensing display apparatus and furnishing the same with advantages of the touch panel and the OLED should be resolved for developing the OLED touch-sensing display apparatus.

SUMMARY OF THE INVENTION

A touch-sensing display apparatus is provided in the present application. A touch panel thereof not only has a touch-sensing function, but can also be used as an upper package cover for packaging an environmentally sensitive electronic device.

A fabricating method of a touch-sensing display apparatus is provided in the present application. The touch-sensing display apparatus have better water/oxygen blocking ability.

A touch-sensing display apparatus including a touch panel, an environmentally sensitive electronic device, and an adhesive layer is provided. An overall water/oxygen vapor transmission rate (WVTR/OTR) of the touch panel is lower than $10^{-1}$ g/m$^2$*day. Moreover, the touch panel includes a first substrate, a sensing circuit, and at least one water/oxygen barrier layer. The first substrate is a first flexible substrate or a glass substrate. The sensing circuit and the water/oxygen barrier layer are disposed on the first substrate. The environmentally sensitive electronic device includes a second substrate, a pixel array, and a display medium. The pixel array and the display medium are disposed on the second substrate and located between the first substrate and the second substrate. The adhesive layer is adhered between the touch panel and the environmentally sensitive electronic device.

A fabricating method of a touch-sensing display apparatus is provided in the present application. In the fabricating method, a touch panel is formed, an environmentally sensitive electronic device is formed, and an adhesive layer is formed. The method of forming the touch panel includes the following steps. Firstly, a first substrate is provided. Next, a sensing circuit is formed on the first substrate. Thereafter, at least one water/oxygen barrier layer is formed on the first substrate. Moreover, an adhesive layer is formed between the touch panel and the environmentally sensitive electronic device, so that the touch panel and the environmentally sensitive electronic device are connected to complete the touch-sensing display apparatus.

In light of the foregoing, the touch panel in the touch-sensing display apparatus not only has the touch function but can also be adopted as the upper cover for packaging the environmentally sensitive electronic device. In addition, the touch panel of the present application performs protection specifically to the environmentally sensitive electronic device, so that the environment electronic device isolates water and oxygen which deteriorate the device.

In order to make the aforementioned and other features and advantages of the present application more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
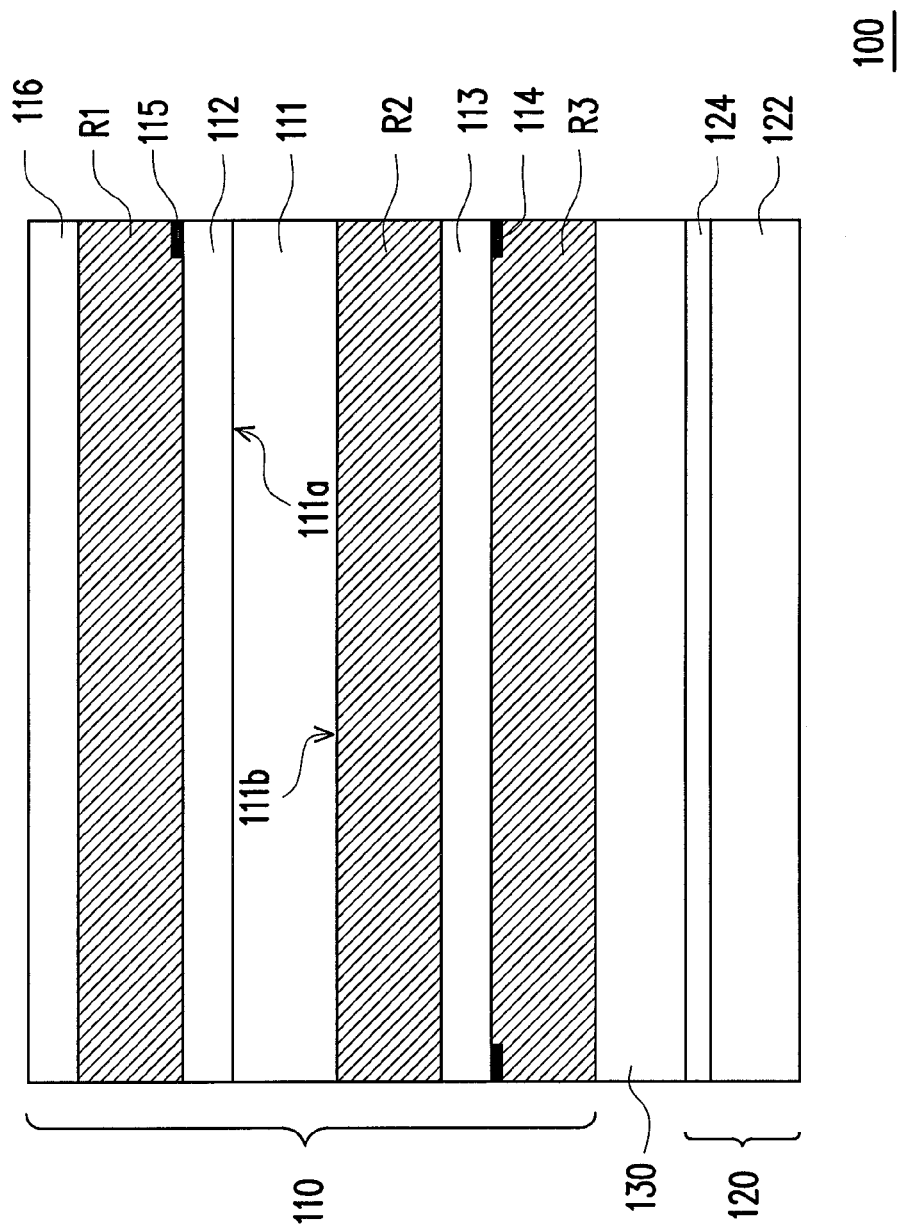
FIG. 1A illustrates a schematic view of a touch-sensing display apparatus according to one embodiment of the present application.

FIG. 1A illustrates a schematic view of a touch-sensing display apparatus according to one embodiment of the present application. Referring to FIG. 1A, a touch-sensing display apparatus 100 of the present application includes a surface capacitive touch panel 110, an environmentally sensitive electronic device 120, and an adhesive layer 130. Particularly, an overall water/oxygen vapor transmission rate (WVTR/OTR) of the surface capacitive touch panel 110 is lower than $10^{-1}$ g/m$^2$*day. Moreover, in some embodiments, the overall WVTR/OTR of the surface capacitive touch panel 110 is lower than $10^{-2}$ g/m$^2$*day preferably. In a preferred embodiment the overall WVTR/OTR of the surface capacitive touch panel 110 is lower than $10^{-3}$ g/m$^2$*day, for example, the overall WVTR/OTR of the surface capacitive touch panel 110 may be lower than $10^{-4}$ g/m$^2$*day, lower than $10^{-5}$ g/m$^2$*day or lower than $10^{-6}$ g/m$^2$*day.

The surface capacitive touch panel 110 includes a first substrate 111, a touch-sensing conductive layer 112, an electromagnetic interference (EMI) shielding layer 113, a first circuit layer 114, a second circuit layer 115, a functional layer 116, a first barrier layer R1, a second barrier layer R2, and a third barrier layer R3.

In the surface capacitive touch panel 110 aforementioned, the first substrate 111 is a first flexible substrate. Here, the first substrate 111 has a first surface 111a and a second surface 111b which is opposite to the first surface 111a.

The touch-sensing conductive layer 112, the EMI shielding layer 113, the first circuit layer 114, the second circuit layer 115, the functional layer 116, the first barrier layer R1, the second barrier layer R2, and the third barrier layer R3 are respectively located on two sides of the first substrate 111.

The touch-sensing conductive layer 112, the second circuit layer 115, the first barrier layer R1, and the functional layer 116 are located on one side of the first surface 111a of the first substrate 111. The touch-sensing conductive layer 112 and the second circuit layer 115 are electrically connected. Moreover, the touch-sensing conductive layer 112 and the second circuit layer 115 are located on the first surface 111a of the first substrate 111. The functional layer 116 covers the touch-sensing conductive layer 112 and the second circuit layer 115. The first barrier layer R1 is disposed between the functional layer 116 and the touch-sensing conductive layer 112.

The EMI shielding layer 113, the first circuit layer 114, the second barrier layer R2, and the third barrier layer R3 are located on one side of the second surface 111b of the first substrate 111. Herein, the EMI shielding layer 113 is disposed between the first substrate 111 and the first circuit layer 114, and the second barrier layer R2 is disposed between the first substrate 111 and the EMI shielding layer 113. The third barrier layer R3 is disposed between the adhesive layer 130 and the EMI shielding layer 113.

It should be illustrated that in the present application, dispositions of the first barrier layer R1, the second barrier layer R2, and the third barrier layer R3 are not necessary. In other embodiments, the touch-sensing display apparatus 100 can merely include one or two of the first barrier layer R1, the second barrier layer R2, and the third barrier layer R3.

The environmentally sensitive electronic device 120 includes a second substrate 122, a pixel array, and a display medium 124, for example. The pixel array and the display medium 124 are disposed on the second substrate 122 and located between the first substrate 111 and the second substrate 122. The adhesive layer 130 is adhered between the surface capacitive touch panel 110 and the environmentally sensitive electronic device 120. For example, the environmentally sensitive electronic device 120 is an organic light emitting diode (OLED) display device, a liquid crystal display (LCD) device, or an electrophoretic display (EPD) device Specifically, a material of the first flexible substrate 111 is, for example, polyethylene terephthalate (PET), polyethylene naphthalate (PEN), polyester (PES), polymethylmethacrylate (PMMA), polycarbonate (PC), polyimide (PI), or metal foil.

In addition, a material of the touch-sensing conductive layer 112 and the EMI shielding layer 113 is an inorganic transparent conductive material or an organic transparent conductive material, for instance. Furthermore, a material of the first circuit layer 114 and the second circuit layer 115 is a metal conductive material, for example.

The functional layer 116, for instance, is an anti-reflection layer, an anti-glare layer, an anti-smudge layer, a hard coating layer, or a combination thereof. However, in FIG. 1A, only the functional layer 116 is represented. According to different functions of film layers, the materials incorporated are also different. To give an example, a material of the anti-reflection layer is silicon oxide ($SiO_2$) or titanium dioxide ($TiO_2$). On the other hand, a material of the anti-glare layer is $SiO_2$, $TiO_2$, indium oxide ($In_2O_3$), or zinc oxide (ZnO). A material of the anti-smudge layer is a fluorine-containing silicon material, for instance. A material of the hard coating layer is $SiO_2$, tantalum oxide (TaO), zirconium oxide ($ZrO_2$), or diamond-like carbon (DLC).

The first barrier layer R1, the second barrier layer R2, and the third barrier layer R3 are respectively a single layer or multiple layers of an organic thin film or an inorganic thin film, or a combination thereof. To give an example, the inorganic material includes aluminum oxide ($Al_2O_3$), silicon oxide, ($SiO_x$), silicon nitride ($SiN_x$), or silicon oxynitride ($SiO_xN_y$). On the other hand, the organic material includes parylene or acrylic. In addition, when the first barrier layer R1 and the second barrier layer R2 are organic materials, a water transmission rate (WVTR) of $10 \sim 10^2$ g/m$^2$*day is obtained. Moreover, in some embodiments, WVTR/OTR of organic film is between $1 \sim 10$ g/m$^2$*day preferably. When the first barrier layer R1 and the second barrier layer R2 are inorganic material, a WVTR/OTR of $10^{-1}$-$10^{-3}$ g/m$^2$*day is obtained.

Furthermore, in the present embodiment, the adhesive layer 130 is an optical adhesive layer, for instance. Here, a surface of the optical adhesive layer 130 is adhered to the surface capacitive touch panel 110, and another surface of the optical adhesive layer 130 is adhered to the environmentally sensitive electronic device 120. The optical adhesive layer 130 connects the surface capacitive touch panel 110 and the environmentally sensitive electronic device 120 In addition, different optical adhesive layers 130 with different refractive indexes can be selected according to actual requirements so as to enhance the display quality of the touch-sensing display apparatus 100.

Figure 1B:
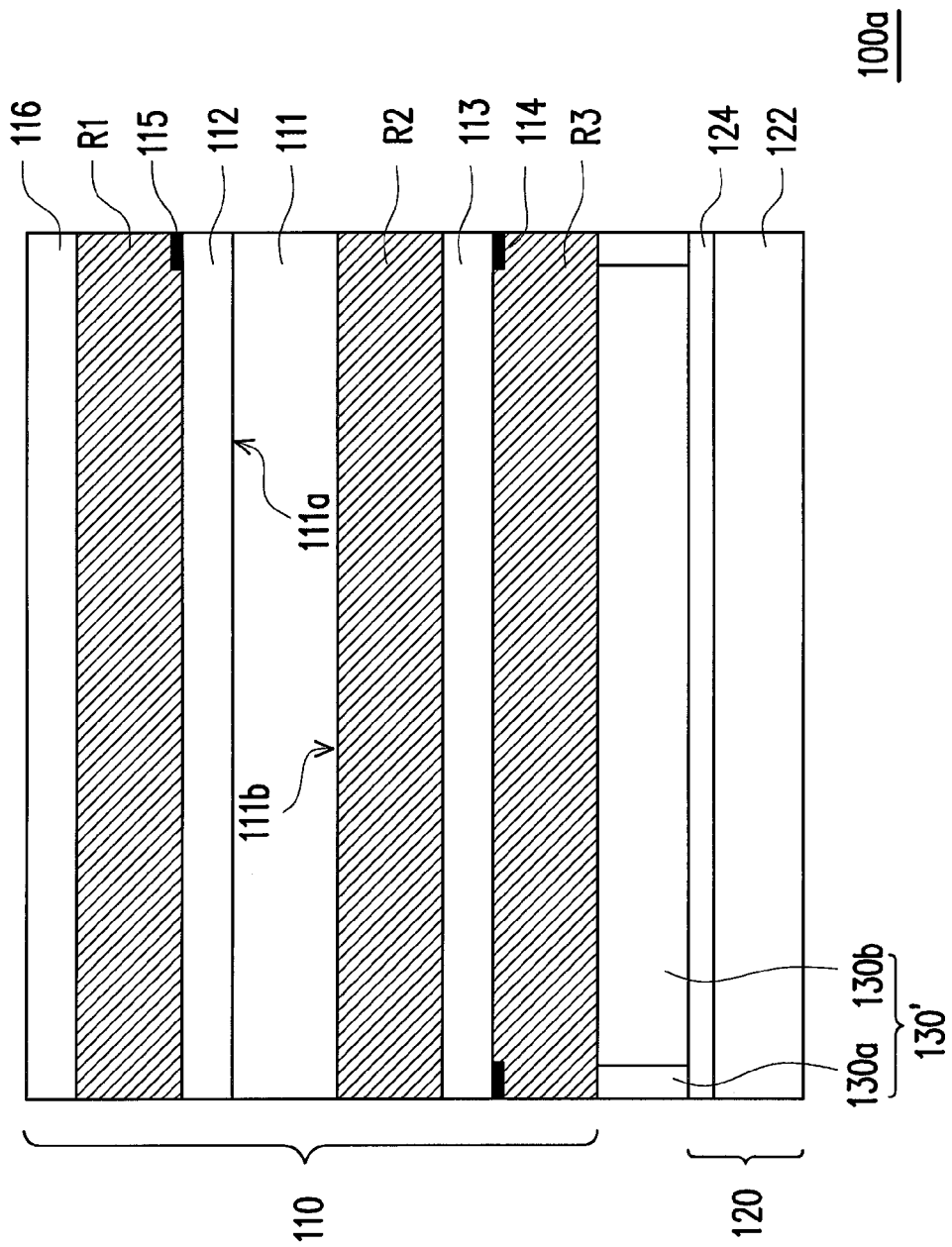
FIG. 1B illustrates a schematic view of a touch-sensing display apparatus according to another embodiment of the present application.

FIG. 1B illustrates a schematic view of a touch-sensing display apparatus according to another embodiment of the present application. In another embodiment of the present application, an adhesive layer 130' of a touch-sensing display apparatus 100a includes a sealant 130a and an optical fill 130b, for example. A material of the optical fill 130b, for instance, is a thermo-curable liquid acrylic or an UV-curable liquid acrylic.

In the touch-sensing display apparatus 100a, the sealant 130a, the surface capacitive touch panel 110, and the environmentally sensitive electronic device 120 together enclose a space (not shown). Additionally, the optical fill 130b is disposed within the space together enclosed by the sealant 130a, the surface capacitive touch panel 110, and the environmentally sensitive electronic device 120.

The touch-sensing display apparatuses 100 and 100a in the above-mentioned embodiments combine the surface capacitive touch panel 110 and the environmentally sensitive electronic device 120. Generally, when packaging the environmentally sensitive electronic device 120, an upper cover is required conventionally. However, in the aforementioned embodiments, the surface capacitive touch panel 110 is adopted as the upper cover for packaging the environmentally sensitive electronic device 120, so that thicknesses and weights of the touch-sensing display apparatuses 100 and 100a are reduced effectively. In the following, a flowchart is used to illustrate a fabricating method of the touch-sensing display apparatus 100 in detail.

Figure 2:
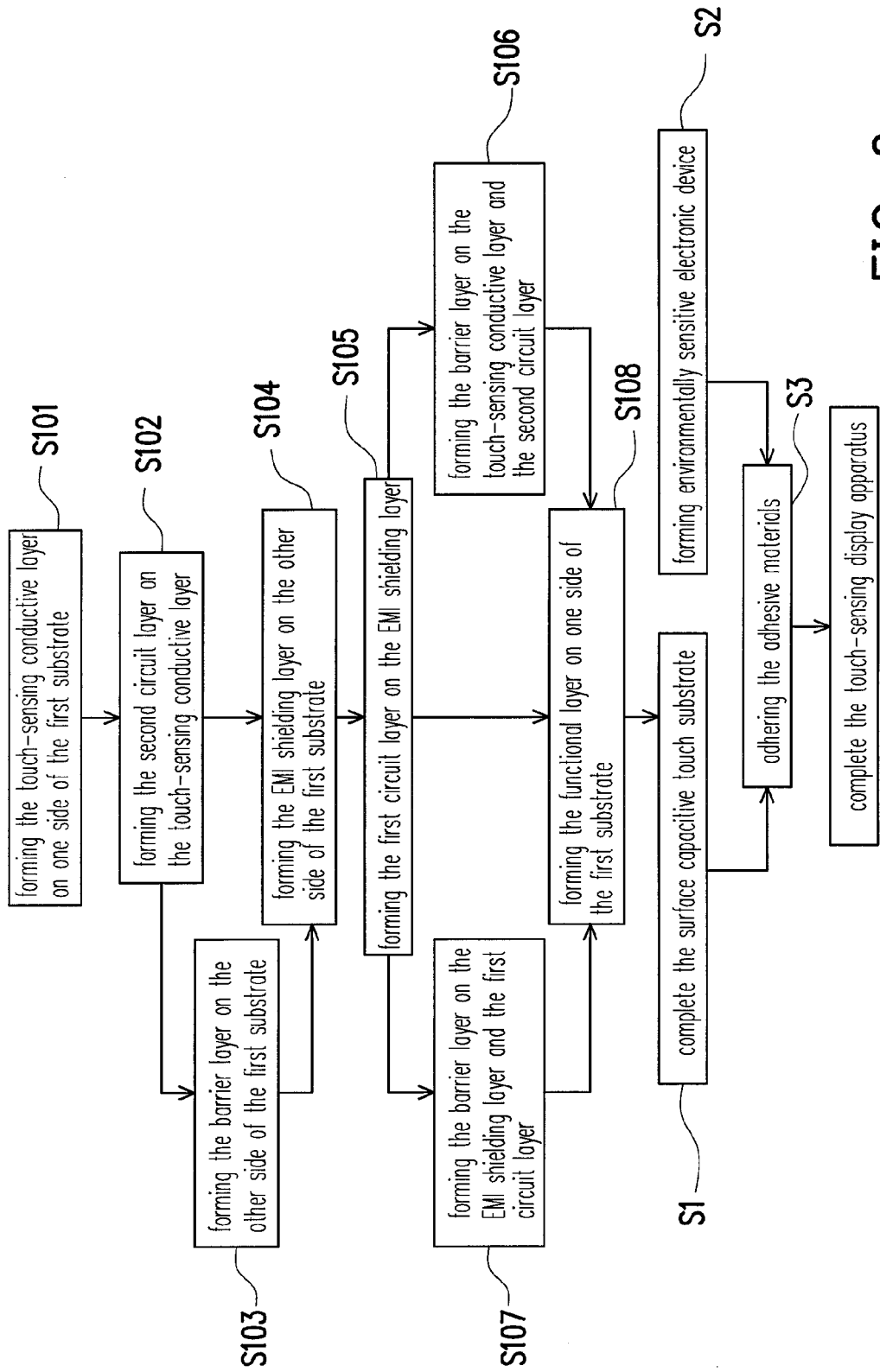
FIG. 2 is a flowchart illustrating a fabricating method of the touch-sensing display apparatus in FIG. 1A.

FIG. 2 is a flowchart illustrating a fabricating method of the touch-sensing display apparatus in FIG. 1A. Referring to FIG. 1A and FIG. 2, a fabricating method of the touch-sensing display apparatus 100 includes step S1 for forming the surface capacitive touch panel 110, step S2 for forming the environmentally sensitive electronic device 120, and step S3 for forming the adhesive layer 130 to adhere adhesive materials, so that the surface capacitive touch panel 110 adheres to the environmentally sensitive electronic device 120 to complete the touch-sensing display apparatus 100.

In details, a method of forming the surface capacitive touch panel 110 includes the following steps. Firstly, step S101 is performed to form the touch-sensing conductive layer 112 at one side of the first substrate 111. Specifically, the touch-sensing conductive layer 112 can be formed on the first surface 111a of the first substrate 111. Next, step S102 is carried out to form the second circuit layer 115 on the touch-sensing conductive layer 112. A method of forming the touch-sensing conductive layer 112 and the second circuit layer 115 is screen-printing process, ink jet process, photolithographic process, or sputtering process, for example.

Thereafter, step S103 is performed to form a barrier layer on the other side of the first substrate 111. That is, the second barrier layer R2 is formed on the second surface 111b of the first substrate 111. A method of forming the barrier layer, for instance, is to perform chemical vapor phase deposition (CVD), spraying, flow coating, ink jet printing, or spin coating with organic materials or perform electron beam evaporation, sputtering, or CVD with inorganic materials.

Subsequently, step S104 is carried out to form the EMI shielding layer 113 on the other side of the first substrate 111. That is, the EMI shielding layer 113 is formed at one side of the second surface 111b of the first substrate 111 and below the barrier layer R2. Step S105 is further performed to form the first circuit 114 on the EMI shielding layer 113.

Afterwards, step S106 is performed to form the first barrier layer R1 on the touch-sensing conductive layer 112 and the second circuit layer 115. On the other hand, step S107 is executed to form the third barrier layer R3 on the EMI shielding layer 113 and the first circuit layer 114. The method of forming the first barrier layer R1 and the third barrier layer R3 is similar to the method of forming the second barrier layer R2.

Then, step S108 is optionally performed to form the functional layer 116 at one side of the first substrate 111. In the present embodiment, the functional layer 116 is formed on the first barrier layer R1. A method of forming the functional layer 116 includes electron beam evaporation, sputtering, spin coating, dipping, spraying, flow coating, ink jet printing, or CVD.

Finally, the adhering of the adhesive materials in step S3 is performed to form the adhesive layer 130 between the surface capacitive touch panel 110 and the environmentally sensitive electronic device 120, so that the surface capacitive touch panel 110 adheres to the environmentally sensitive electronic device 120 to complete the touch-sensing display apparatus 100.

It should be noted that the touch-sensing display apparatuses 100 and 100a, and the fabricating method of the touch-sensing display apparatus 100 are merely exemplary. In other words, the present application is not limited thereto. Other than the surface capacitive touch panel above-mentioned, embodiments adopting a projected capacitive touch panel or a resistive touch panel are illustrated in the following.

Figure 3A:
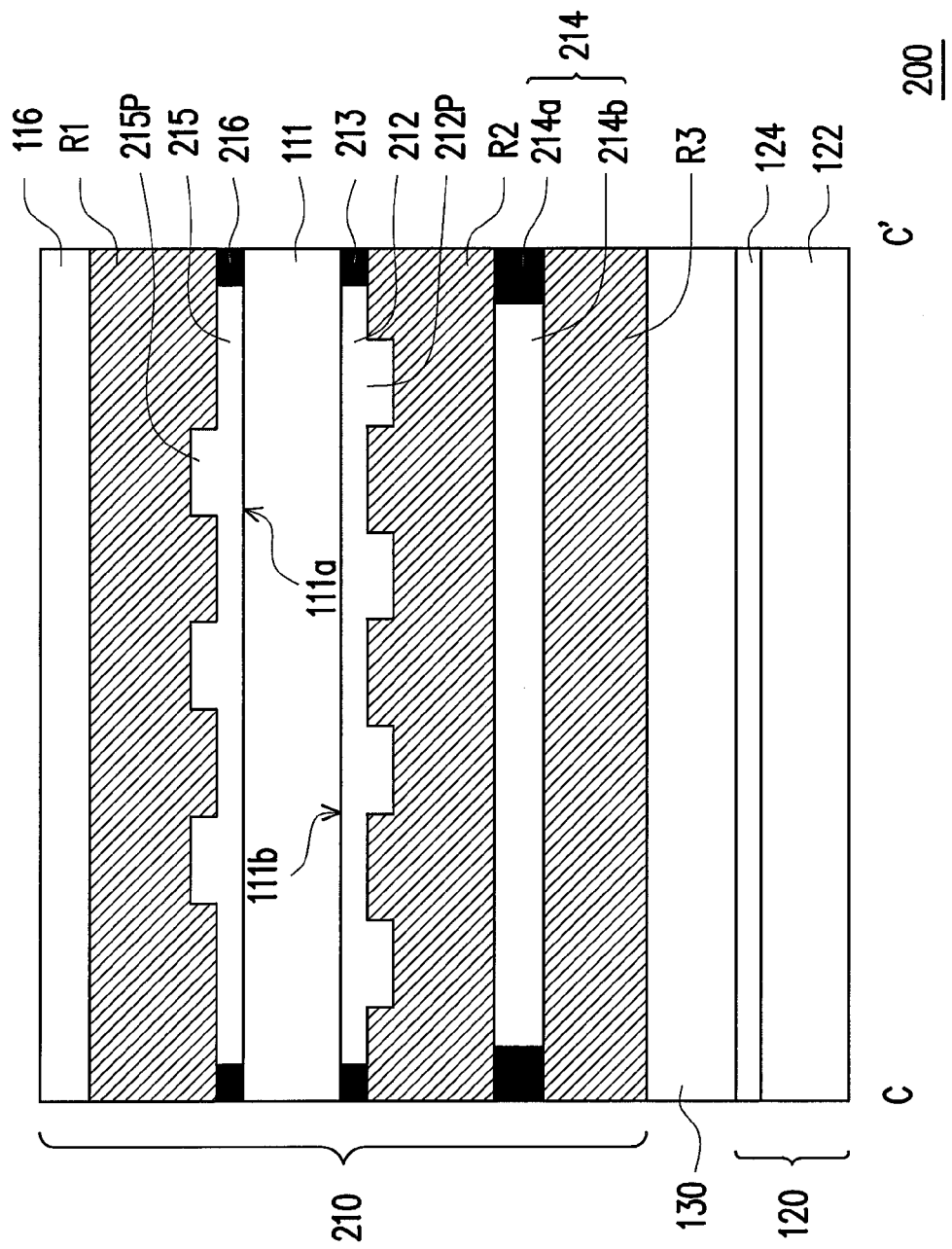
FIG. 3A illustrates a schematic view of a touch-sensing display apparatus according to one embodiment of the present application.
Figure 3B:
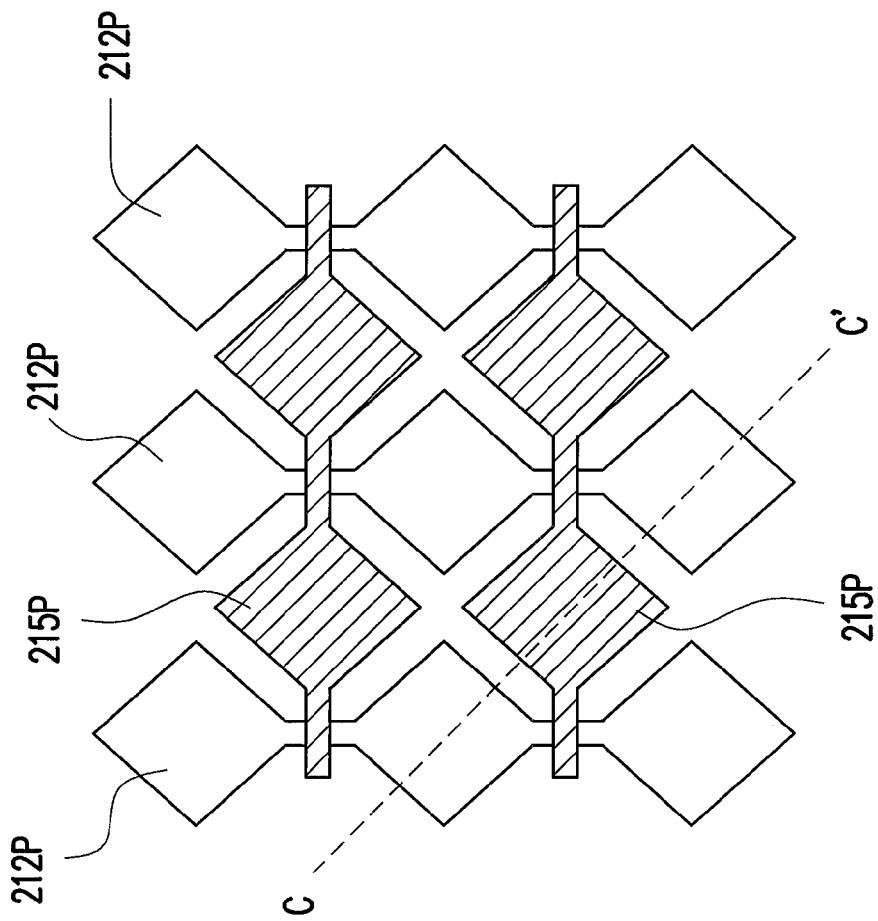
FIG. 3B is a partial schematic top view of a sensing circuit of the touch-sensing display apparatus in FIG. 3A.

FIG. 3A illustrates a schematic view of a touch-sensing display apparatus according to one embodiment of the present application. FIG. 3B is a partial schematic top view of a sensing circuit of the touch-sensing display apparatus in FIG. 3A. Herein, FIG. 3A is a schematic cross-sectional view taken along line c-c' in FIG. 3B. Referring to FIG. 3A and FIG. 3B, a touch-sensing display apparatus 200 of the present application includes a projected capacitive touch panel 210, the environmentally sensitive electronic device 120, and the adhesive layer 130. An overall water/oxygen blocking ability of the projective capacitive touch panel 210 is lower than $10^{-1}$ $g/m^2*day$. In some embodiments, the overall WVTR/OTR of the projected capacitive touch panel 210 is lower than $10^{-2}$ $g/m^2*day$ or $10^{-3}$ $g/m^2*day$ or $10^{-4}$ $g/m^2*day$ or $10^{-5}$ $g/m^2*day$ or $10^{-6}$ $g/m^2*day$.

In the touch-sensing display apparatus 200, the projected capacitive touch panel 210 includes the first substrate 111 (the first flexible substrate 111), a first touch-sensing conductive layer 212, a first circuit layer 213, an electromagnetic interference (EMI) shielding layer 214, a second touch-sensing conductive layer 215, a second circuit layer 216, the functional layer 116, the first barrier layer R1, the second barrier layer R2, and the third barrier layer R3.

The second touch-sensing conductive layer 215, the second circuit layer 216, the functional layer 116, and the first barrier R1 are located on one side of the first surface 111a of the first substrate 111. Here, the second touch-sensing conductive layer 215 has a patterned design. To give an example, the second touch-sensing conductive layer 215 has a plurality of touch pads 215P, and the second touch-sensing conductive layer 215 is electrically connected to the second circuit layer 216. Moreover, the second touch-sensing conductive layer 215 and the second circuit layer 216 are located on the first surface 111a of the first substrate 111.

The functional layer 116 covers the second touch-sensing conductive layer 215 and the second circuit layer 216. The first barrier layer R1 is disposed between the functional layer 116 and the second touch-sensing conductive layer 215.

The first touch-sensing conductive layer 212, the first circuit layer 213, the EMI shielding layer 214, the second barrier layer R2, and the third barrier layer R3 are located on one side of the second surface 111b of the first substrate 111. Here, the first touch-sensing conductive layer 212 has a plurality of touch pads 212P, for example. The first touch-sensing conductive layer 212 and the first circuit layer 213 are electrically connected, and the first touch-sensing conductive layer 212 and the first circuit layer 213 are located at one side of the second surface 111b of the first substrate 111.

The EMI shielding layer 214 is disposed between the first touch-sensing conductive layer 212 and the environmentally sensitive electronic device 120. In the present embodiment, the EMI shielding layer 214 further includes a ground circuit 214a and a shielding region 214b.

The second barrier layer R2 is disposed between the first substrate 111 and the EMI shielding layer 214. The third barrier layer R3 is disposed between the adhesive layer 130 and the EMI shielding layer 214.

Similarly, the touch-sensing display apparatus 200 is merely exemplary and the present application does not limit the dispositions of the first barrier layer R1, the second barrier layer R2, and the third barrier layer R3. In other embodiments, the touch-sensing display apparatus adopting the projected capacitive touch panel can merely include one or two of the first barrier layer R1, the second barrier layer R2, and the third barrier layer R3.

Figure 4:
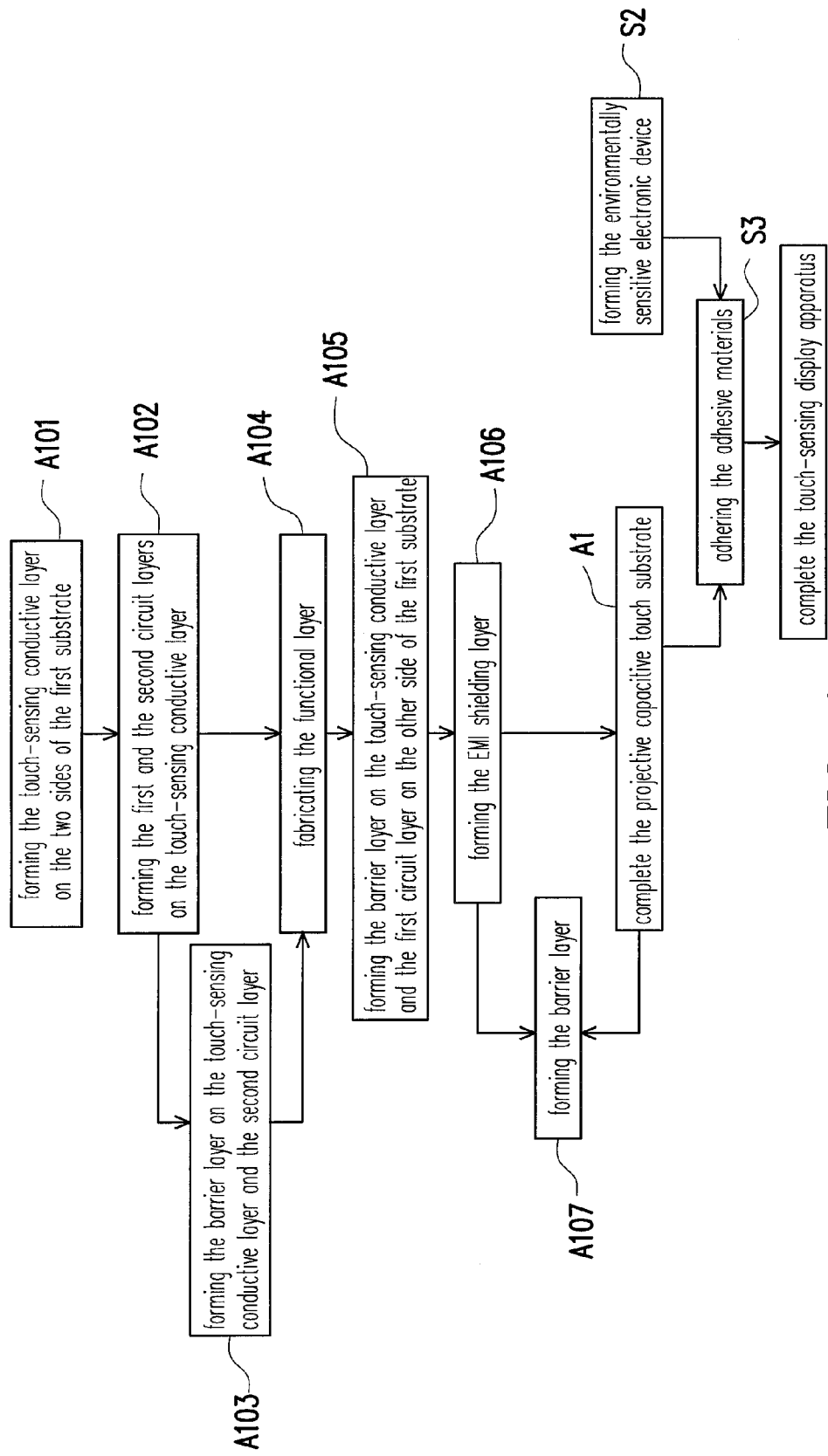
FIG. 4 is a flowchart illustrating a fabricating method of the touch-sensing display apparatus in FIG. 3A.

FIG. 4 is a flowchart illustrating a fabricating method of the touch-sensing display apparatus in FIG. 3A. Referring to FIG. 3A, FIG. 3B, and FIG. 4 simultaneously, generally, a fabricating method of the touch-sensing display apparatus 200 includes step A1 for forming the projected capacitive touch panel 210, step S2 for forming the environmentally sensitive electronic device 120, and step S3 for forming the adhesive layer 130 to adhere the adhesive materials, so that the projected capacitive touch panel 210 adheres to the environmentally sensitive electronic device 120 to complete the touch-sensing display apparatus 200.

In details, a method of forming the projected capacitive touch panel 210 includes the following steps. Firstly, step A101 is performed for forming a touch-sensing conductive layer on the two sides of the first substrate 111. Specifically, the second touch-sensing conductive layer 215 with patterns of the touch pads 215P is formed on the first surface 111a of the first substrate 111. Also, the first touch-sensing conductive layer 212 with patterns of the touch pads 212P is formed on the second surface 111b of the first substrate 111. A method of forming the first touch-sensing conductive layer 212 and the second touch-sensing conductive layer 215, for instance, is spin coating process, laser etching process, photolithographic process, or sputtering process.

Next, step A102 is performed for forming the first circuit layer 213 on the first touch-sensing conductive layer 212 and the second circuit layer 216 on the second touch-sensing conductive layer 215.

Thereafter, step A103 is perform to fabricate the first barrier layer R1 on the second touch-sensing conductive layer 215 and the second circuit layer 216. Subsequently, step A104 is carried out to fabricate the functional layer 116 which is formed on the first barrier layer R1.

Afterwards, step A105 is executed for fabricating the second barrier layer R2 on the first touch-sensing conductive layer 212 and the first circuit layer 213 located on the other side (one side of the second surface 111b) of the first substrate 111.

Then, step A106 is performed to form the EMI shielding layer 214 below the second barrier layer R2. After that, step A107 is executed for forming the third barrier layer R3 under the EMI shielding layer 214. At this point, the fabrication of the projected capacitive touch panel 210 is completed.

Lastly, the adhering of the adhesive materials in step S3 is performed to form the adhesive layer 130 between the projected capacitive touch panel 210 and the environmentally sensitive electronic device 120, so that the projected capacitive touch panel 210 adheres to the environmentally sensitive electronic device 120 to complete the touch-sensing display apparatus 200.

Figure 5A:
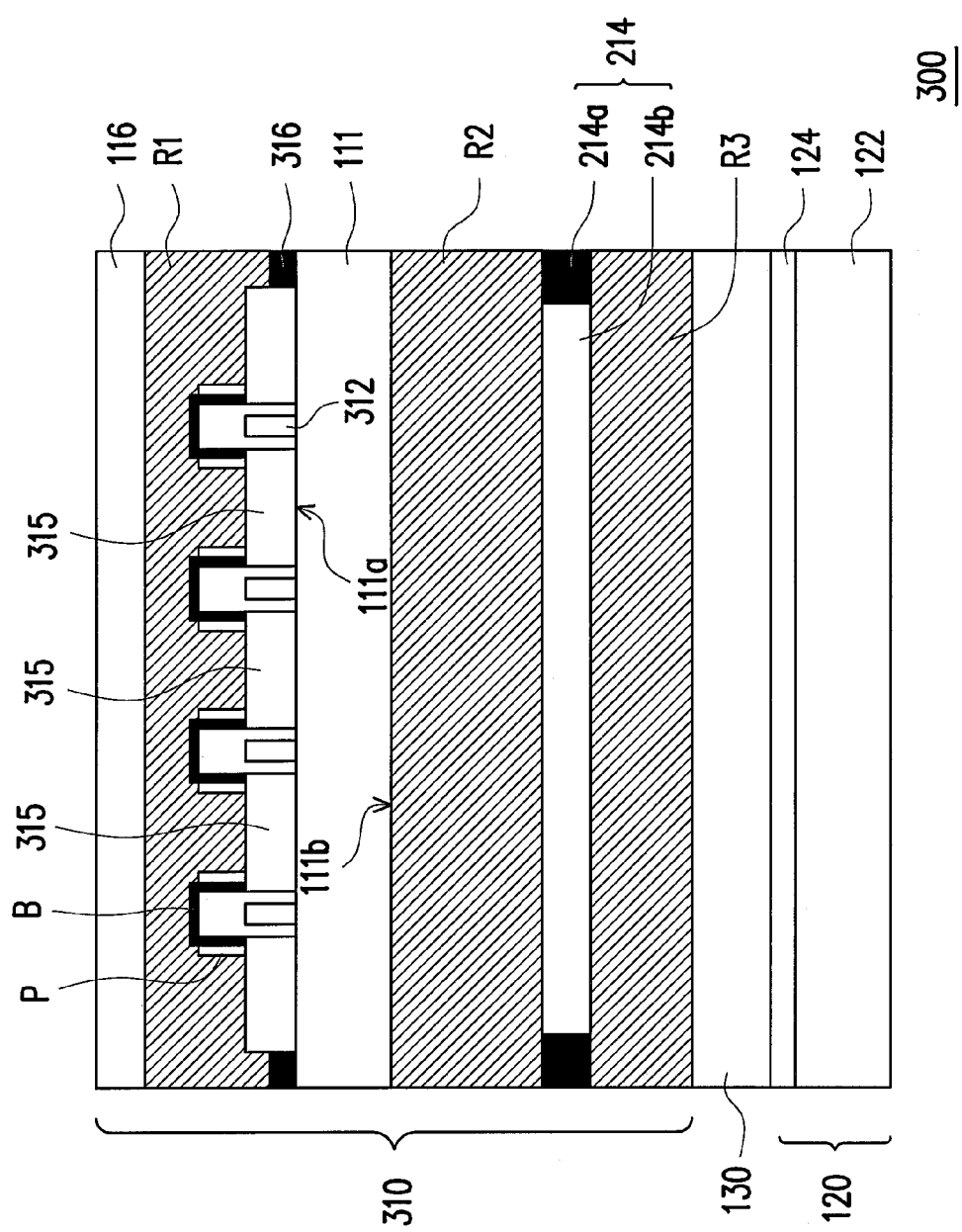
FIG. 5A illustrates a schematic view of a touch-sensing display apparatus according to one embodiment of the present application.
Figure 5B:
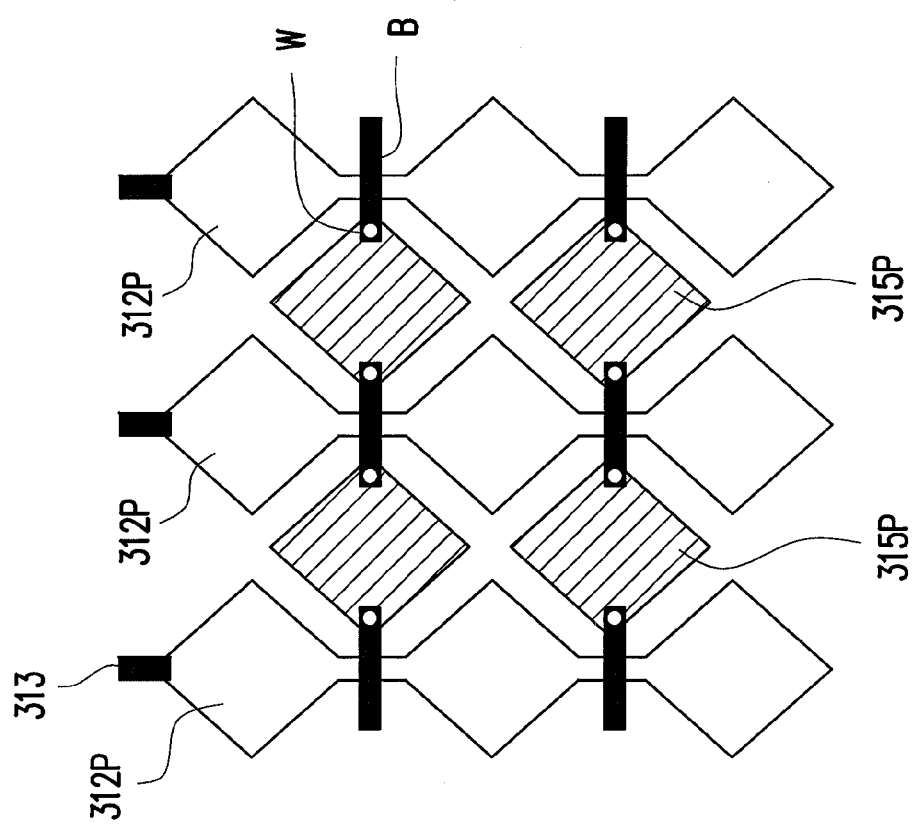
FIG. 5B is a partial schematic top view of a sensing circuit of the touch-sensing display apparatus in FIG. 5A.

FIG. 5A illustrates a schematic view of a touch-sensing display apparatus according to one embodiment of the present application. FIG. 5B is a partial schematic top view of a sensing circuit of the touch-sensing display apparatus in FIG. 5A.

Referring to FIG. 5A and FIG. 5B, a touch-sensing display apparatus 300 of the present embodiment includes a projected capacitive touch panel 310, the environmentally sensitive electronic device 120, and the adhesive layer 130. An overall WVTR/OTR of the projected capacitive touch panel 310 is lower than $10^{-1}$ g/m$^2$*day. Besides, in some embodiments, the overall WVTR/OTR of the projective capacitive touch panel 310 is lower than $10^{-2}$ g/m$^2$*day. In a preferred embodiment the overall WVTR/OTR of the surface capacitive touch panel 110 is lower than $10^{-3}$ g/m$^2$*day, for example, the overall WVTR/OTR of the surface capacitive touch panel 110 may be lower than $10^{-4}$ g/m$^2$*day, lower than $10^{-5}$ g/m$^2$*day or lower than $10^{-6}$ g/m$^2$*day.

The projected capacitive touch panel 310 includes the first substrate 111 (the first flexible substrate 111), a first touch-sensing conductive layer 312, a first circuit layer 313, the EMI shielding layer 214, a second touch-sensing conductive layer 315, a second circuit layer 316, the functional layer 116, the first barrier layer R1, the second barrier layer R2, and the third barrier layer R3.

It should be noted that in the projected capacitive touch panel 310, the first touch-sensing conductive layer 312, the first circuit layer 313, the second touch-sensing conductive layer 315, the second circuit layer 316, the first barrier layer R1, and the functional layer 116 are all located at one side of the first surface 111a of the first substrate 111.

A sensing circuit of the projected capacitive touch panel 310 includes the first touch-sensing conductive layer 312, the first circuit layer 313, the second touch-sensing conductive layer 315, and the second circuit layer 316. Here, the first touch-sensing conductive layer 312 has the touch pads 312P and the second touch-sensing conductive layer 315 has the touch pads 315P. The first touch-sensing conductive layer 312 and the first circuit layer 313 are electrically connected. The second touch-sensing conductive layer 315 and the second circuit layer 316 are electrically connected. Moreover, the functional layer 116 covers the sensing circuit of the projected capacitive touch panel 310. Furthermore, the first barrier layer R1 is disposed between the functional layer 116 and the sensing circuit aforementioned.

In the projected capacitive touch panel 310, since the first touch-sensing conductive layer 312 and the second touch-sensing conductive layer 315 are both located at one side of the first surface 111a of the first substrate 111, the first substrate 111 further includes a passivation layer P, so that the first touch-sensing conductive layer 312 and the second touch-sensing conductive layer 315 are insulated. Additionally, in order for the touch pads 315P of the second touch-sensing conductive layer 315 to be electrically connected, a plurality of contact windows W and a plurality of metal lead bridges B are formed on the passivation layer P.

The EMI shielding layer 214, the second barrier layer R2, and the third barrier layer R3 are located on one side of the second surface 111b of the first substrate 111. The EMI shielding layer 214 is disposed between the first substrate 111 and the environmentally sensitive electronic device 120. The second barrier layer R2 is disposed between the first substrate 111 and the EMI shielding layer 214. The third barrier layer R3 is disposed between the adhesive layer 130 and the EMI shielding layer 214.

Figure 6:
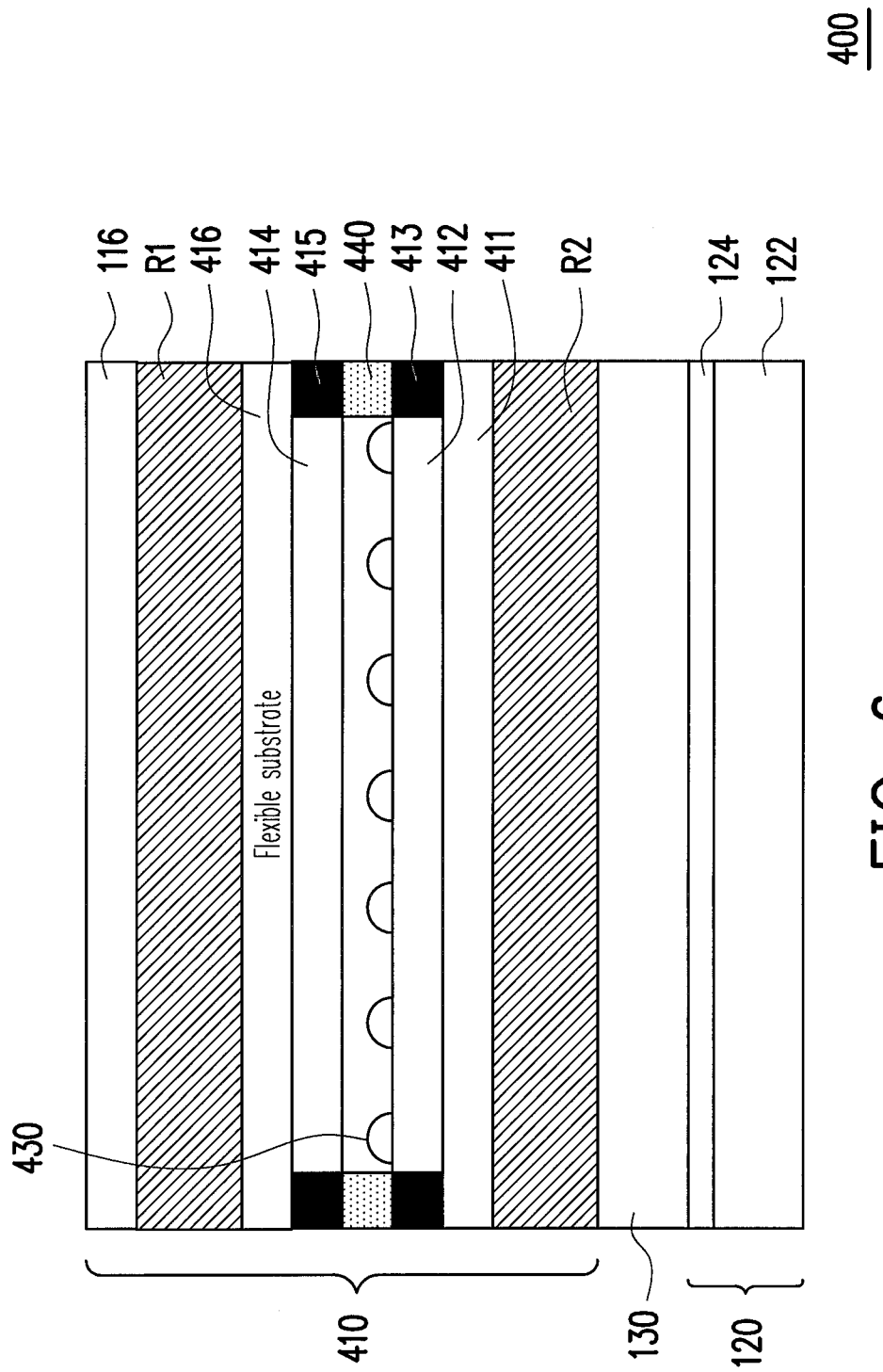
FIG. 6 illustrates a schematic view of a touch-sensing display apparatus according to one embodiment of the present application.

FIG. 6 illustrates a schematic view of a touch-sensing display apparatus according to one embodiment of the present application. Referring to FIG. 6, a touch-sensing display apparatus 400 of the present application includes a resistive touch panel 410, the environmentally sensitive electronic device 120, and the adhesive layer 130. An overall WVTR/OTR of the resistive touch panel 410 is lower than $10^{-1}$ g/m$^2$*day and preferably lower than $10^{-2}$ g/m$^2$*day. In a preferred embodiment the overall WVTR/OTR of the surface capacitive touch panel 110 is lower than $10^{-3}$ g/m$^2$*day, for example, the overall WVTR/OTR of the surface capacitive touch panel 110 may be lower than $10^{-4}$ g/m$^2$*day, lower than $10^{-5}$ g/m$^2$*day or lower than $10^{-6}$ g/m$^2$*day.

In the touch-sensing display apparatus 400, the resistive touch panel 410 includes a first flexible substrate 411, a first touch-sensing conductive layer 412, a first circuit layer 413, a second touch-sensing conductive layer 414, a second circuit layer 415, a second flexible substrate 416, the functional layer 116, the first barrier layer R1, and the second barrier layer R2.

Here, the first touch-sensing conductive layer 412, the first circuit layer 413, the second touch-sensing conductive layer 414, and the second circuit layer 415 are located between the first flexible substrate 411 and the second flexible substrate 416.

Generally, a plurality of spacers 430 and a sealant 440 are further included between the first flexible substrate 411 and the second flexible substrate 416. Especially, the sealant 440, the first touch-sensing conductive layer 412, and the second touch-sensing conductive layer 414 together enclose a space and the spacers 430 are located therein.

In the present embodiment, the functional layer 116 covers the second flexible substrate 416 and the first barrier layer R1 is disposed between the second flexible substrate 416 and the functional layer 116. In addition, the second barrier layer R2 is disposed between the first flexible substrate 411 and the adhesive layer 130.

The touch-sensing display apparatuses illustrated in the embodiments above-mentioned all adopt a flexible substrate as the substrate of the touch panel. However, the present application is not limited thereto. In other embodiments, a rigid substrate is also used as the substrate of the touch panel. Several exemplary embodiments are described below to illustrate in detail.

Figure 7:
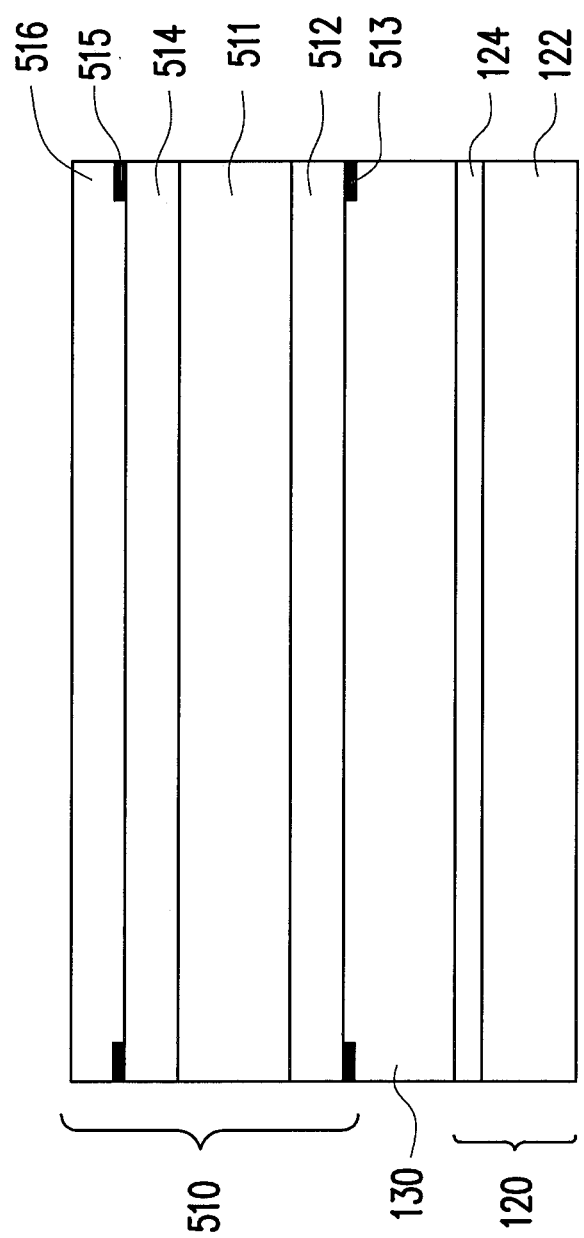
FIG. 7 illustrates a schematic view of a touch-sensing display apparatus according to one embodiment of the present application.

FIG. 7 illustrates a schematic view of a touch-sensing display apparatus according to one embodiment of the present application. Referring to FIG. 7, a touch-sensing display apparatus 500 of the present embodiment includes a surface capacitive touch panel 510, the environmentally sensitive electronic device 120, and the adhesive layer 130. An overall WVTR/OTR of the surface capacitive touch panel 510 is lower than $10^{-1}$ g/m$^2$*day.

The surface capacitive touch panel 510 includes a first substrate 511, an electromagnetic interference (EMI) shielding layer 512, a first circuit layer 513, a touch-sensing conductive layer 514, a second circuit layer 515, and a functional layer 516. Particularly, in the surface capacitive touch panel 510, the first substrate 511 is a rigid substrate such as a glass substrate.

In the surface capacitive touch panel 510, the touch-sensing conductive layer 514, the second circuit layer 515, and the functional layer 516 are located at one side of the first substrate 511. On the other hand, the first circuit layer 513 and the EMI shielding layer 512 are located at the other side of the first substrate 511. Herein, the touch-sensing conductive layer 514 and the second circuit layer 515 are electrically connected. The functional layer 516 covers the touch-sensing conductive layer 514 and the second circuit layer 515. Also, the EMI shielding layer 512 is disposed between the first substrate 511 and the first circuit layer 513.

Compared to the touch-sensing display apparatus 100 in FIG. 1A, in the touch-sensing display apparatus 500 shown in FIG. 7, the first substrate 511 of the surface capacitive touch panel 510 applies a rigid substrate such as a glass substrate. Since the glass substrate has better water/oxygen blocking ability, the touch-sensing display apparatus 500 adopting the surface capacitive touch panel 510 consequently obtains better water/oxygen blocking ability.

Figure 8:
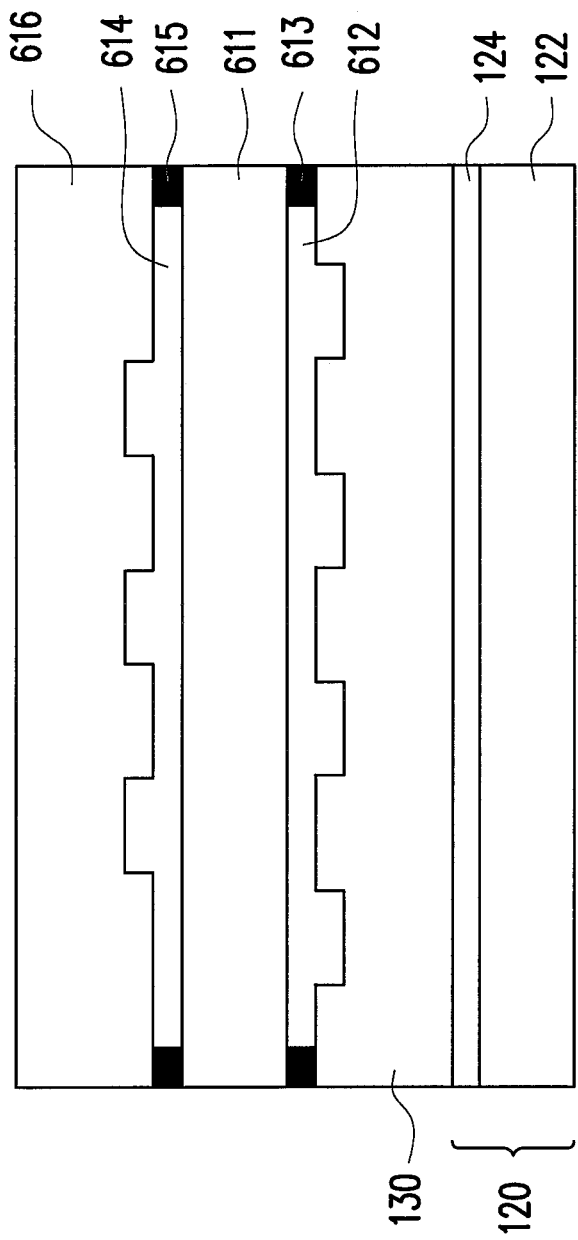
FIG. 8 illustrates a schematic view of a touch-sensing display apparatus according to one embodiment of the present application.

FIG. 8 illustrates a schematic view of a touch-sensing display apparatus according to one embodiment of the present application. Referring to FIG. 3A and FIG. 8, a touch-sensing display apparatus 600 of the present embodiment is a projective capacitive touch-sensing display apparatus. However, a difference between the touch-sensing display apparatus 600 and the touch-sensing display apparatus 200 is that the touch-sensing display apparatus 600 is a projected capacitive touch-sensing display apparatus adopting the rigid substrate.

The touch-sensing display apparatus 600 includes a first substrate 611, a first touch-sensing conductive layer 612, a first circuit layer 613, a second touch-sensing conductive layer 614, a second circuit layer 615, a functional layer 616, the environmentally sensitive electronic device 120, and the adhesive layer 130.

Figure 9:
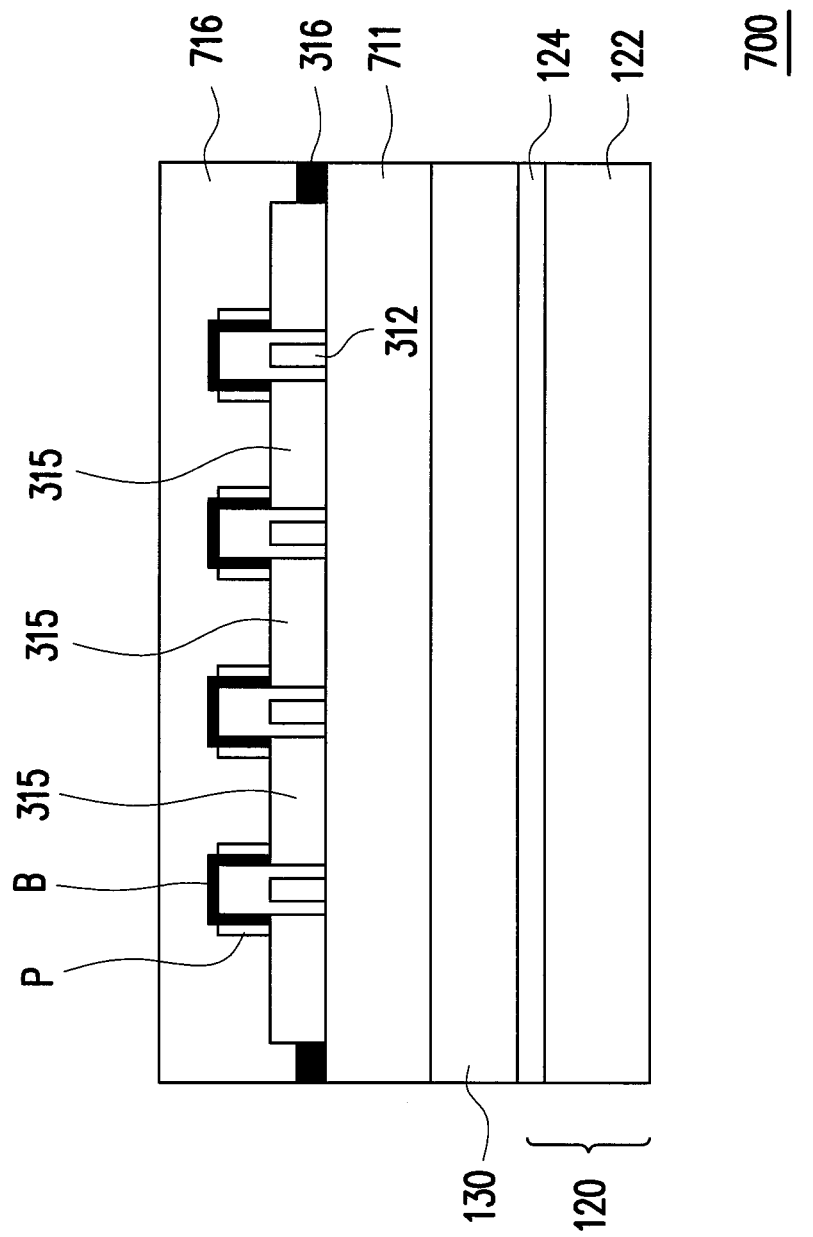
FIG. 9 illustrates a schematic view of a touch-sensing display apparatus according to one embodiment of the present application.

FIG. 9 illustrates a schematic view of a touch-sensing display apparatus according to one embodiment of the present application. Referring to FIG. 5A and FIG. 8, similarly, a touch-sensing display apparatus 700 is a projected capacitive touch-sensing display apparatus. However, a difference between the touch-sensing display apparatus 700 and the touch-sensing display apparatus 300 is that the touch-sensing display apparatus 700 is a projected capacitive touch-sensing display apparatus adopting the rigid substrate.

The touch-sensing display apparatus 700 includes a first substrate 711, the first touch-sensing conductive layer 312, the first circuit layer 313, the second touch-sensing conductive layer 315, the second circuit layer 316, a functional layer 716, the environmentally sensitive electronic device 120, and the adhesive layer 130.

In summary, the touch-sensing display apparatus of the present application connects the touch panel and the environmentally sensitive electronic device. Thus, the touch panel not only has the touch function but can also be used as the upper cover for packaging the environmentally sensitive electronic device. Hence, the touch-sensing display apparatus seldom has the problem of being too thick or too heavy. The fabricating method of the touch-sensing display apparatus integrates the packaging process of the environmentally sensitive electronic device into the manufacture of the touch apparatus, thereby reducing the production cost and the fabricating procedure.

In addition, the touch panel of the present application includes the surface capacitive touch substrate, the projected capacitive touch substrate, and the resistive touch substrate while providing the water/oxygen barrier layer to the environmentally sensitive electronic device.

Although the present application has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A touch-sensing display apparatus, comprising:
  a surface capacitive touch panel, wherein an overall water/oxygen vapor transmission rate (WVTR/OTR) thereof is lower than 10-1 g/m2*day, and the surface capacitive touch panel comprises:
    a first substrate, being a first flexible substrate; and
    a sensing circuit, disposed on the first substrate, comprising:
      a first circuit layer;
      a second circuit layer; and
      a touch-sensing conductive layer, electrically connected to the second circuit layer, wherein the first circuit layer is located at one side of the first substrate, and the second circuit layer and the touch-sensing conductive layer are located at the other side of the first substrate;
  a functional layer, covering the touch-sensing conductive layer and the second circuit layer;
  a first barrier layer, disposed between the functional layer and the touch-sensing conductive layer;
  a second barrier layer, disposed between the first substrate and the first circuit layer;
  an environmentally sensitive electronic device, comprising:
    a second substrate; and
    a pixel array and a display medium, disposed on the second substrate and located between the first substrate and the second substrate; and
  an adhesive layer, adhered between the touch panel and the environmentally sensitive electronic device.

2. The touch-sensing display apparatus as claimed in claim 1, further comprising an electromagnetic interference (EMI) shielding layer disposed between the first substrate and the first circuit layer.

3. The touch-sensing display apparatus as claimed in claim 2, wherein the second barrier layer is disposed between the first substrate and the EMI shielding layer.

4. The touch-sensing display apparatus as claimed in claim 2, further comprising a third barrier layer disposed between the adhesive layer and the EMI shielding layer.

5. The touch-sensing display apparatus as claimed in claim 1, wherein the overall WVTR/OTR of the touch panel is lower than $10^{-2}$ g/m$^2$*day.

6. The touch-sensing display apparatus as claimed in claim 1, wherein the overall WVTR/OTR of the touch panel is lower than $10^{-3}$ g/m$^2$*day.

7. The touch-sensing display apparatus as claimed in claim 1, wherein the overall WVTR/OTR of the touch panel is lower than $10^{-4}$ g/m$^2$*day.

8. The touch-sensing display apparatus as claimed in claim 1, wherein the overall WVTR/OTR of the touch panel is lower than $10^{-5}$ g/m$^2$*day.

9. The touch-sensing display apparatus as claimed in claim 1, wherein the overall WVTR/OTR of the touch panel is lower than $10^{-6}$ g/m$^2$*day.

10. The touch-sensing display apparatus as claimed in claim 1, wherein the environmentally sensitive electronic device comprises an organic light emitting diode (OLED) display device, a liquid crystal display (LCD) device, or an electrophoretic display device.

11. A touch-sensing display apparatus, comprising:
  a projected capacitive touch panel, wherein an overall water/oxygen vapor transmission rate (WVTR/OTR) thereof is lower than 10-1 g/m2*day, and the projected capacitive touch panel comprises:
    a first substrate, being a first flexible substrate; and
    a sensing circuit, disposed on the first substrate, comprising:
      a first circuit layer;
      a first touch-sensing conductive layer, electrically connected to the first circuit layer;
      a second circuit layer; and
      a second touch-sensing conductive layer, electrically connected to the second circuit layer, wherein the first circuit layer and the first touch-sensing conductive layer are located at one side of the first substrate while the second circuit layer and the second touch-sensing conductive layer are located at the other side of the first substrate;
  a functional layer, covering the second touch-sensing conductive layer and the second circuit layer;
  a first barrier layer, disposed between the functional layer and the second touch-sensing conductive layer;
  a second barrier layer;
  an environmentally sensitive electronic device, comprising:
    a second substrate; and
    a pixel array and a display medium, disposed on the second substrate and located between the first substrate and the second substrate; and
  an adhesive layer, adhered between the touch panel and the environmentally sensitive electronic device, wherein the second barrier layer is disposed between the first substrate and the adhesive layer.

12. The touch-sensing display apparatus as claimed in claim 11, further comprising an electromagnetic interference (EMI) shielding layer disposed between the first touch-sensing conductive layer and the environmentally sensitive electronic device.

13. The touch-sensing display apparatus as claimed in claim 12, wherein the second barrier layer is disposed between the first touch-sensing conductive layer and the EMI shielding layer.

14. The touch-sensing display apparatus as claimed in claim 12, further comprising a third barrier layer disposed between the adhesive layer and the EMI shielding layer.

15. A touch-sensing display apparatus, comprising:
  a projected capacitive touch panel, wherein an overall water/oxygen vapor transmission rate (WVTR/OTR) thereof is lower than 10-1 g/m2*day, and the projected capacitive touch panel comprises:
    a first substrate, being a first flexible substrate; and
    a sensing circuit, disposed on the first substrate, comprising:
      a first circuit layer;
      a first touch-sensing conductive layer, electrically connected to the first circuit layer;
      a second circuit layer; and
      a second touch-sensing conductive layer, electrically connected to the second circuit layer, wherein the first circuit layer, the first touch-sensing conductive layer, the second circuit layer, and the second touch-sensing conductive layer are located at one side of the first substrate;
  a functional layer, covering the sensing circuit;

a first barrier layer, disposed between the functional layer and the sensing circuit;

a second barrier layer;

an environmentally sensitive electronic device, comprising:
  a second substrate; and
  a pixel array and a display medium, disposed on the second substrate and located between the first substrate and the second substrate; and an adhesive layer, adhered between the touch panel and the environmentally sensitive electronic device, wherein the second barrier layer is disposed between the first substrate and the adhesive layer.

16. The touch-sensing display apparatus as claimed in claim 15, further comprising an electromagnetic interference (EMI) shielding layer disposed between the first substrate and the environmentally sensitive electronic device.

17. The touch-sensing display apparatus as claimed in claim 16, wherein the second barrier layer is disposed between the first substrate and the EMI shielding layer.

18. The touch-sensing display apparatus as claimed in claim 16, further comprising a third barrier layer disposed between the adhesive layer and the EMI shielding layer.

19. A touch-sensing display apparatus, comprising:
  a resistive touch panel, wherein an overall water/oxygen vapor transmission rate (WVTR/OTR) thereof is lower than 10-1 g/m2*day, and the resistive touch panel comprises:
    a first substrate, being a first flexible substrate;
    a second flexible substrate; and
    a sensing circuit, disposed on the first substrate, comprising:
      a first circuit layer;
      a first touch-sensing conductive layer, electrically connected to the first circuit layer;
      a second circuit layer; and
      a second touch-sensing conductive layer, electrically connected to the second circuit layer, wherein the first circuit layer, the first touch-sensing conductive layer, the second circuit layer, and the second touch-sensing conductive layer are located between the first flexible substrate and the second flexible substrate;
  a functional layer, covering the second flexible substrate;
  a first barrier layer, disposed between the second flexible substrate and the functional layer;
  a second barrier layer;
  an environmentally sensitive electronic device, comprising:
    a second substrate; and
    a pixel array and a display medium, disposed on the second substrate and located between the first substrate and the second substrate; and
  an adhesive layer, adhered between the touch panel and the environmentally sensitive electronic device, wherein the second barrier layer is disposed between the first substrate and the adhesive layer.

20. The touch-sensing display apparatus as claimed in claim 19, wherein the second barrier layer is disposed between the first flexible substrate and the adhesive layer.

21. The touch-sensing display apparatus as claimed in claim 1, wherein the adhesive layer comprises an optical adhesive layer and one surface of the optical adhesive layer is adhered to the touch panel while the other surface is adhered to the environmentally sensitive electronic device.

22. The touch-sensing display apparatus as claimed in claim 1, wherein the adhesive layer comprises a sealant, and the sealant, the touch panel, and the environmentally sensitive electronic device together enclose a space.

23. The touch-sensing display apparatus as claimed in claim 22, wherein the adhesive layer further comprises an optical fill, disposed within the space formed by the sealant, the touch panel, and the environmentally sensitive electronic device.

* * * * *